United States Patent

Kashima et al.

[11] Patent Number: 5,932,326
[45] Date of Patent: Aug. 3, 1999

[54] CERAMIC WIRING BOARDS AND METHOD FOR THEIR MANUFACTURE

[75] Inventors: Hisahito Kashima; Shigeru Taga, both of Aichi, Japan

[73] Assignee: NGK Spark Plug Co., Ltd., Japan

[21] Appl. No.: 08/850,632

[22] Filed: May 2, 1997

[30] Foreign Application Priority Data

May 28, 1996 [JP] Japan ..................................... 8-157709
Mar. 10, 1997 [JP] Japan ..................................... 9-074550

[51] Int. Cl.$^6$ ....................................................... B32B 3/00
[52] U.S. Cl. .......................... 428/209; 428/210; 428/472; 428/701; 428/702; 264/61
[58] Field of Search ..................................... 428/195, 209, 428/210, 472, 701, 702; 264/61

[56] References Cited

U.S. PATENT DOCUMENTS 4,927,505  5/1990  Sharma ................................. 204/34.5

*Primary Examiner*—Timothy M. Speer
*Attorney, Agent, or Firm*—Brinks Hofer Gilson & Lione

[57] ABSTRACT

A ceramic wiring board having a metalized part. The metalized part contains 100 parts by weight of an electrical-conduction imparting material made of at least one metal selected from the group consisting of Ag, Pd, Au and Pt; 3 to 5 parts by weight of a W and/or Mo compound, calculated in terms of metal W and/or metal Mo; and 1 to 10 parts by weight of a glass composition. The W compound includes $WO_3$ and/or $WSi_2$, while the Mo compound includes $MoSi_2$. In the ceramic wiring board, the shrinkage behavior on sintering of the wiring material can be made similar to that of the ceramic material, so that warping and deformation of the wiring board are minimized.

23 Claims, No Drawings

CERAMIC WIRING BOARDS AND METHOD FOR THEIR MANUFACTURE

BACKGROUND OF THE INVENTION

1. Field of the Invention

The present invention relates to low temperature sintered ceramic wiring boards and a method for their manufacture. In particular, the present invention relates to low temperature sintered glass ceramic wiring boards in which a low melting point metal such as Ag, Pd or Au, or a mixture of such a low melting point metal and Pt is metalized as a wiring material.

2. Related Art

Wiring boards employing an alumina-based ceramic as an insulating material are used as wiring boards for the mounting of semiconductor elements such as LSIs. However, since the sintering temperature of such an alumina-based ceramic material is high, there are the following problems. Since a high melting point metal such as W or Mo is used as a wiring material that can be sintered at the same time, the electrical resistance of the wiring layer can be as high as 10 to 20 $m\Omega/mm^2$. Thus, wiring boards have been in which a low resistance wiring material, such as Ag or Au, and a low temperature sintering insulating material, such as glass or glass ceramic, could be sintered at the same time. In particular, glass ceramic wiring boards can be sintered at a low temperature of about 800 to 1100° C. and also have excellent mechanical strength since they contain a ceramic crystal phase as a structural component. Therefore, such glass ceramic wiring boards have received much attention recently.

However, the metalization composition used for such wiring boards is made of Ag or Au and optionally include Pd, Pt, or the like, so that its sintering commencement temperature is about 600 to 700° C. On the other hand, the glass ceramic has a softening point of about 700 to 900° C. When there is a large difference between the commencement temperature of the metalization composition and the sintering commencement temperature of the glass ceramic, during the initial stage of sintering only the metalization composition starts to compact and the glass ceramic starts to compact at a higher temperature; thus, a difference in compaction exists. As a result, the wiring board is warped or deformed and it becomes impossible to obtain a board of the prescribed dimensions and shape. As a countermeasure, there has been considered a method in which a glass component having a softening point similar to or higher than that of the glass ceramic is added to the metalization composition, but the sintering commencement temperature of the metalization composition is not greatly increased. There is another method in which a ceramic substrate of alumina, for example, having a flat surface is placed on the wiring board during sintering to forcibly suppress warping. However, when the size of the wiring board increases, there arise problems that uniform compaction cannot be achieved and that the wiring board becomes stuck to the ceramic substrate.

SUMMARY OF THE INVENTION

An object of the invention is to provide a low temperature sintered ceramic wiring board in which a low melting point metal such as Ag, Pd or Au, or a mixture of such a low melting point material and Pt is metalized as a wiring material and in which the shrinkage behavior on sintering of the wiring material is made similar to that of the ceramic material so as to minimize warping and deformation of the wiring board.

Another object of the present invention is to provide a method of manufacturing such an improved ceramic wiring board.

To achieve the above objects, the present invention provides a ceramic wiring board having a substrate made of an insulating material and a metalized part which contains: 100 parts by weight of an electrical-conduction imparting material made of at least one metal selected from the group consisting of Ag, Pd, Au and Pt; 3 to 5 parts by weight of a W and/or Mo compound, calculated in terms of metal W and/or metal Mo; and 1 to 10 parts by weight of a glass composition.

The amount of the W and/or Mo compound is preferably 3.25 to 5 parts by weight in terms of metal W and/or metal Mo.

The W compound preferably includes $WO_3$ and/or $WSi_2$, while the Mo compound preferably includes $MoSi_2$.

The insulating material is preferably a glass ceramic.

The above-described glass composition is preferably a borosilicate glass or aluminoborosilicate glass, or one which becomes a glass ceramic upon sintering.

The present invention also provides a ceramic wiring board having a substrate made of an insulating material and a metalized part which contains: 100 parts by weight of an electrical-conduction imparting material including at least Ag; 3 to 5 parts by weight of a W and/or Mo compound, calculated in terms of metal W and/or metal Mo; and 1 to 10 parts by weight of a glass composition.

The W and/or Mo compound preferably includes at least one compound selected from the group consisting of $Ag_2WO_4$ and $Ag_2MoO_4$.

The insulating material is preferably a glass ceramic.

The glass composition is preferably a borosilicate glass or aluminoborosilicate glass, or one which becomes a glass ceramic upon sintering.

The present invention further provides a method for manufacturing a ceramic wiring board having a metalized part comprising the steps of applying a metalization paste to a ceramic green sheet, and sintering the ceramic green sheet to obtain a ceramic wiring board. The metalization paste contains 100 parts by weight of powder of an electrical-conduction imparting material made of at least one metal selected from the group consisting of Ag, Pd, Au and Pt; 3 to 5 parts by weight, calculated in terms of metal W or metal Mo, of at least one kind of powder selected from the group consisting of W powder, Mo powder, W compound powder, and Mo compound powder; and 1 to 10 parts by weight of glass powder.

The ceramic green sheet is preferably one which becomes a glass ceramic upon sintering.

The glass composition is preferably a borosilicate glass or aluminoborosilicate glass, or one which becomes a glass ceramic upon sintering.

These and other aspects and advantages of the invention are described or apparent from the following detailed description of the preferred embodiments.

DETAILED DESCRIPTION OF THE PREFERRED EMBODIMENTS

Examples of the electrical-conduction imparting metal comprising at least one of Ag, Pd, Au and Pt include those which contain two or more of these metals as well as Ag, Pd, Au, and Pt alone. For example, in those cases where migration presents a problem due to sole use of Ag, it is preferred to use an Ag—Pd alloy such as $Ag_{80}$—$Pd_{20}$. Furthermore, the present invention can be applied to the case where the wiring board has multi-layer wiring, in which the inner wiring is made of Ag or an Ag—Pd alloy containing a small amount of Pd, which has a high electrical conductivity, while the surface layer wiring is made of an $Ag_{80}$—$Pd_{20}$ alloy so as to prevent migration, or in which the wiring layers are made of different wiring materials.

The reasons why the amount of the W and/or Mo compound calculated in terms of metal W and/or metal Mo is set to 3 to 5 parts by weight are as follows. If the amount added is less than 3 parts by weight, the effect of adding the compound, i.e., the effect of raising the sintering commencement temperature of the metalized part, is not achieved satisfactorily. On the other hand, if the amount exceeds 5 parts by weight, the electrical conductivity is reduced because the proportion of W and/or Mo compound having a low conductivity or providing insulation is increased. Furthermore, at the same time, asperity (blistering) is produced on the top surface of the surface wiring, and this is undesirable. Moreover, the amount of W and/or Mo compound is preferably set in the range of 3.25 to 5 parts by weight, calculated in terms of metal W and/or metal Mo, so as to reduce the electrical resistance of the wiring and to minimize warping and deformation of the wiring board.

In terms of the method of manufacture, the use of W and Mo metal powders is preferred. This is because W and Mo metal powders of uniform particle size and shape are easily available and can be mixed uniformly with powder of electrical-conduction imparting metal. Alternatively, oxides, carbides, nitrides, silicides, borides, and other compounds of W and Mo can also be used.

The glass composition is added to promote sintering of the electrical-conduction imparting metal comprising Ag, Pd, Au and/or Pt, or to adjust the sintering temperature. Furthermore, in those cases where the electrical-conduction imparting metal is sintered in the form of a porous material, it is also used to fill the pores and ensure that the metalized part is airtight. Moreover, it also alleviates the difference in thermal expansion of the metalized part with respect to the ceramic part serving as the insulating material, thus functioning to reduce warping and deformation in the course of cooling during the sintering process. A borosilicate glass ($B_2O_3/SiO_2$-based glass), an aluminoborosilicate glass $B_2O_3/SiO_2/Al_2O_3$-based glass), or a glass ceramic, for example, can be used for this glass composition. Furthermore, the material used as the insulating material of the wiring board can also be used for the glass composition.

The amount of glass composition is set to be in the range of 1 to 10 parts by weight since the above-described object cannot be achieved if the amount is less than 1 part by weight. Furthermore, if the amount exceeds 10 parts by weight, the resistance of the metalized part is increased, and this is undesirable. Moreover, in such a case, the glass component in the metalized part formed on the surface of a wiring board may be precipitated out on the outer surface, or the outer surface may become covered with the glass component, and this is undesirable.

The glass ceramics preferably used for the insulating material of the ceramic wiring board of the present invention are those in which a ceramic filler such as alumina, anorthite, cordierite, or silica is mixed with a glass powder such as borosilicate glass powder or aluminoborosilicate glass powder and then sintered, or a partially crystallized glass in which crystal phase is formed in the glass during sintering, or a completely crystallized glass.

In the powder of electrical-conduction imparting metal containing at least one of Ag, Pd, Au, and Pt, at least one kind of powder selected from the group consisting of W powder, Mo powder, W compound powder, and Mo compound powder is added and dispersed. Since the added powder is harder to be sintered compared to the electrical-conduction imparting metal, it is possible to suppress the sintering of the powder of electrical-conduction imparting material, thereby raising the sintering commencement temperature thereof. In a conventional ceramic wiring board, softening and sintering shrinkage of the metalized part proceeds at a lower temperature than the ceramic part. In contrast, in the ceramic wiring board of the present invention, the softening and sintering shrinkage of the metalized part occur in a temperature region that is closer to the sintering temperature of the ceramic part. Hence, through use of the metalization composition of the present invention, it becomes possible to suppress the occurrence of warping and deformation of the wiring board during sintering.

EXAMPLES AND COMPARATIVE EXAMPLES

Examples 1 to 16

Ag powder having an average particle size of 3.0 µm, $Ag_{80}$—$Pd_{20}$ alloy powder having an average particle size of 3.0 µm, Au powder having an average particle size of 2.0 µm, and Pt powder having an average particle size of 3.0 µm were used as metal powders for providing electric conductivity. In Example 16, a mixed powder which contained Ag powder was used and Pt powder in a predetermined ratio by weight. Both W and Mo were in the form of metal powder. The average particle sizes of W and Mo were both 2.5 µm. An aluminoborosilicate glass $Ba_2O_3/SiO_2/Al_2O_3$-based glass) was used for the glass composition. Specifically, a glass comprising $SiO_2$: 43%, $Al_2O_3$: 28%, $B_2O_3$: 8%, MgO: 8%, CaO: 12% and $ZrO_2$: 1% (amounts are indicated in proportions by weight) was fused and powdered to obtain material having an average particle size of 1.0 µm. These oxide powders were weighed in the respective proportions by weight shown in Table 1, based on 100 parts by weight of the powder of electrical-conduction imparting material. The oxide powders were then mixed. Moreover, a BCA (butylcarbitol acetate) solution containing 20 wt % of ethylcellulose was mixed as a vehicle in an amount of 20 parts by weight per 100 parts by weight of metal powder for providing electric conductivity, so as to form a metalizing paste.

TABLE 1

| | Conductive powder (100 parts by weight) | W (parts by weight) | Mo (parts by weight) | Glass (parts by weight) | Warp of Sinter ($\mu$m) | Surface resistance (m$\Omega$/mm$^2$) |
|---|---|---|---|---|---|---|
| Example 1 | Ag80/Pd20 | 3 | | 3 | 98 | 31.0 |
| Example 2 | Ag80/Pd20 | 3.25 | | 3 | 79 | 31.3 |
| Example 3 | Ag80/Pd20 | 3.5 | | 3 | 75 | 31.5 |
| Example 4 | Ag80/Pd20 | 3.75 | | 3 | 75 | 31.6 |
| Example 5 | Ag80/Pd20 | 4 | | 3 | 73 | 31.8 |
| Example 6 | Ag80/Pd20 | 5 | | 3 | 85 | 32.0 |
| Example 7 | Ag80/Pd20 | 1 | 3 | 3 | 58 | 31.3 |
| Example 8 | Ag80/Pd20 | 2 | 2 | 3 | 65 | 31.0 |
| Example 9 | Ag80/Pd20 | 3 | 1 | 3 | 75 | 31.5 |
| Example 10 | Ag80/Pd20 | | 4 | 3 | 68 | 31.0 |
| Example 11 | Ag80/Pd20 | 4 | | 1 | 73 | 30.7 |
| Example 12 | Ag80/Pd20 | 4 | | 5 | 75 | 33.0 |
| Example 13 | Ag80/Pd20 | 4 | | 10 | 70 | 35.0 |
| Example 14 | Ag100 | 4 | | 3 | 65 | 3.5 |
| Example 15 | Au100 | 4 | | 2 | 58 | 5.5 |
| Example 16 | Ag99/Pt1 | 4 | | 2 | 65 | 3.8 |
| Comparative example 1 | Ag80/Pd20 | | | 3 | >1000 | 28.5 |
| Comparative example 2 | Ag80/Pd20 | 1 | | 3 | 350 | 30.5 |
| Comparative example 3 | Ag80/Pd20 | 2 | | 3 | 250 | 30.8 |
| Comparative example 4 | Ag80/Pd20 | 10 | | 3 | 72 | 50.4 |
| Comparative example 5 | Ag80/Pd20 | 4 | | 0.5 | 75 | 29.5 |
| Comparative example 6 | Ag80/Pd20 | 4 | | 12 | 71 | 40.2 |
| Comparative example 7 | Au100 | | | 2 | 450 | 5.0 |

Next, ceramic green sheets as described below were prepared separately. Aluminoborosilicate glass powder and alumina powder were used for the ceramic raw material powders. The aluminoborosilicate glass powder was of the same composition as the above-described glass composition, i.e., $SiO_2$: 43%, $Al_2O_3$: 28%, $B_2O_3$: 8%, MgO: 8%, CaO: 12% and $ZrO_2$: 1%. These oxide powders were weighed, mixed and fused and then quenched to form pellets. The pellets were crushed to prepare material such that the 50% particle size ($D_{50}$)=5 $\mu$m. The softening point of this glass composition was 890° C. Commercial low-soda $\alpha$-alumina powder of $D_{50}$=3 $\mu$m was used for the alumina powder.

An ethyl methacrylate-based acrylic resin was used as a binder. Next, the above-described glass powder and alumina powder were weighed in the proportions by weight of 6:4 to make a total weight of 1 Kg and introduced into a pot made of alumina. Moreover, 200 grams of MEK (methyl ethyl ketone) serving as solvent, 100 grams of the aforementioned acrylic resin, 50 grams of DOP (dioctyl phthalate) serving as plasticizer and 5 grams of dispersant were introduced into the pot and mixed for 10 hours so as to obtain a slurry for forming ceramic green sheets. The doctor blade method was employed to obtain ceramic green sheets having a thickness of 0.4 mm.

Next, test pieces were prepared and evaluated in the below-described manner in order to evaluate warping due to the difference in sintering shrinkage behaviors of the above-described metalizing paste and ceramic green sheet. First, three ceramic green sheets were laminated to provide a thickness of 1.2 mm and the resultant sheet was cut into 40 mm squares to form laminates. Next, the metalizing paste was screen printed so as to provide a thickness of 20 $\mu$m over the entire surface on one side of the laminate and dried at 70° C. Next, the laminate was heat treated for 10 hours at 250° C. in air to remove the binder, and was then sintered through heat treatment for 30 minutes at 950° C. in air.

The warping of the sinter was measured along the diagonal on the surface of the sinter that had not been metalized. The measurement was carried out with a surface roughness gauge and assessment was made on the basis of the maximum value of the warping of the sinter on tracing the diagonal. The results are shown in Table 1. Measurement of warping greater than 1 mm was impossible and in Table 1 such warping is represented as ">1000." As shown in Table 1, in each case of Examples 1 to 16 prepared with metalization compositions within the scope of the invention, the maximum amount of warping was 98 $\mu$m or less. Especially, in Examples 2 and 16 where the amount of W and/or Mo added, calculated in terms of the metal, was 3.25 to 5%, the maximum amount of warping was excellent at 85 $\mu$m or less.

Wiring for measurement purposes having a thickness of 15 $\mu$m, a width of 1 mm and a length of 40 mm after sintering was coated onto separately-provided laminates, which were then sintered. Subsequently, the surface resistance of the metalized part was measured. The results obtained are also shown in Table 1. As is clear from the table, the surface resistance increased with the amount of W and Mo added and with the amount of glass composition added. This increase in the surface resistance is disadvantageous.

When the metalized part of Example 8 was analyzed through X-ray diffraction, peaks for $WO_3$, $Ag_2WO_4$, and $Ag_2MoO_4$ were observed, as well as the peak for the AgPd alloy. Moreover, the $Ag_2WO_4$ and $Ag_2MoO_4$ peaks were shifted toward the Pd side since the Pd was in solid solution in the Ag. It is thought that the W and Mo added as components of the metalizing paste were oxidized during sintering.

A triple-layer wiring board of 40 mm×40 mm×1 mm prepared using the metalizing paste of Example 7 had excellent characteristics in the above-described evaluations, and the amount of warping was satisfactory at 58 μm.

Comparative Examples 1 to 7

Metalizing pastes in which W, Mo and glass composition had been mixed in proportions outside the scope of the invention were prepared, as shown in Table 1. These were evaluated on the basis of the amount of warping and surface resistance in the same manner as were the examples. The amount of warping was greater than 250 μm in Comparative Examples 1, 2, 3 and 7, where the amount of W and Mo, calculated in terms of the metal, was less than 3 parts by weight. On the one hand, the surface resistance was 50.4 mΩ/mm$^2$ in Comparative Example 4 where the amount of W and Mo, calculated in terms of metal, exceeded 5 parts by weight. On the other hand, peeling between the metalized part and the glass ceramic part occurred in Comparative Example 4 where the amount of added glass composition was small. Similarly, surface resistance (volume resistance) reached 40.2 mΩ/mm$^2$ in Comparative Example 6 where the amount of glass composition added was high, and a low resistance could not be achieved.

Examples 17–19

Examples 17 to 19 were evaluated in the same manner as in Example 6 except that the aluminoborosilicate glass used for the ceramic green sheet was changed to the glass compositions shown in Table 2, and the sintering temperature was changed to the temperatures shown in Table 2. In all the sinters, the amount of warping was excellent at 70 μm or less.

TABLE 2

|  | Glass composition (wt. %) | | | | | | Glass softening point (° C.) | Baking temperature (° C.) | Warp of sinter (μm) |
| --- | --- | --- | --- | --- | --- | --- | --- | --- | --- |
|  | SiO$_2$ | Al$_2$O$_3$ | B$_2$O$_3$ | MgO | CaO | ZrO$_2$ |  |  |  |
| Examples 1–16 | 43 | 28 | 8 | 12 | 8 | 1 | 890 | 950 | — |
| Examples 17 | 43 | 29 | 8 | 13 | 6 | 1 | 900 | 960 | 70 |
| Examples 20 | 43 | 29 | 8 | 13 | 6 | 1 | 900 | 960 | 60 |
| Examples 18 | 22 | 23 | 33 | 6 | 16 | 0 | 855 | 915 | 65 |
| Examples 21 | 22 | 23 | 33 | 6 | 16 | 0 | 855 | 915 | 50 |
| Examples 19 | 33 | 29 | 20 | 8 | 10 | 0 | 830 | 890 | 55 |
| Examples 22 | 33 | 29 | 20 | 8 | 10 | 0 | 830 | 890 | 40 |

Examples 20–22

Examples 20 to 22 were evaluated in the same manner as was Example 7 except that the aluminoborosilicate glass used for the ceramic green sheet was changed to the glass compositions shown in Table 2, the sintering temperature was changed to the temperatures shown in Table 2, and the glass compositions of the metalization pastes were of the same composition as the glass of the corresponding ceramic green sheet. In all the sinters, the amount of warping was excellent at 60 μm or less.

While this invention has been described in conjunction with specific embodiments, it is evident that many alternatives, modifications and variations will be apparent to those skilled in the art. Accordingly, the preferred embodiments of the invention as set forth herein are intended to be illustrative, rather than limiting. Various changes may be made without departing from the spirit and scope of the invention as defined in the following claims.

What is claimed is:

1. A ceramic wiring board having a substrate made of an insulating material and a metalized part, said metalized part comprising:
   100 parts by weight of an electrical-conduction imparting material made of at least one metal selected from the group consisting of Ag, Pd, Au and Pt;
   more than 3 to 5 parts by weight of at least one of a W or a Mo compound; and
   1 to 10 parts by weight of a glass composition.

2. The ceramic wiring board according to claim 1, wherein an amount of the at least one of W or Mo compound is 3.25 to 5 parts by weight.

3. The ceramic wiring board according to claim 2, wherein said W compound includes at least one compound selected from the group consisting of WO$_3$ and WSi$_2$.

4. The ceramic wiring board according to claim 3, wherein said insulating material comprises a glass ceramic.

5. The ceramic wiring board according to claim 4, wherein said glass composition is selected from the group consisting of borosilicate glass and aluminoborosilicate glass.

6. The ceramic wiring board according to claim 4, wherein said glass composition is one which becomes a glass ceramic upon sintering.

7. The ceramic wiring board according to claim 2, wherein said Mo compound includes MoSi$_2$.

8. The ceramic wiring board according to claim 7, wherein said insulating material comprises a glass ceramic.

9. The ceramic wiring board according to claim 8, wherein said glass composition is selected from the group consisting of borosilicate glass and aluminoborosilicate glass.

10. The ceramic wiring board according to claim 8, wherein said glass composition is one which becomes a glass ceramic upon sintering.

11. A ceramic wiring board having a substrate made of an insulating material and a metallized part, said metalized part comprising:
    100 parts by weight of an electrical-conduction imparting material including at least Ag;
    more than 3 to 5 parts by weight of at least one of a W or a Mo compound; and
    1 to 10 parts by weight of a glass composition.

12. The ceramic wiring board according to claim 11, wherein said at least one of the W or Mo compound includes at least one compound selected from the group consisting of Ag$_2$WO$_4$ and Ag$_2$MoO$_4$.

13. The ceramic wiring board according to claim 12, wherein said glass composition is selected from the group consisting of borosilicate glass and aluminoborosilicate glass.

14. The ceramic wiring board according to claim 12, wherein said glass composition is one which becomes a glass ceramic upon sintering.

15. The ceramic wiring board according to claim 11, said insulating material comprises a glass ceramic.

16. The ceramic wiring board according to claim 15, wherein said glass composition is selected from the group consisting of borosilicate glass and aluminoborosilicate glass.

17. The ceramic wiring board according to claim 15, wherein said glass composition is one which becomes a glass ceramic upon sintering.

18. A method of manufacturing a ceramic wiring board having a metalized part, comprising the steps of:

applying a metalization paste to a ceramic green sheet and;

sintering the ceramic green sheet to obtain a ceramic wiring board, wherein the metalization paste contains 100 parts by weight of powder of an electrical-conduction imparting material made of at least one metal selected from the group consisting of Ag, Pd, Au, and Pt; more than 3 to 5 parts by weight of at least one kind of powder selected from the group consisting of W powder, Mo powder, W compound powder, or Mo compound powder; and 1 to 10 parts by weight of glass powder.

19. The method of manufacturing a ceramic wiring board according to claim 18, wherein said ceramic green sheet is one which becomes a glass ceramic upon sintering.

20. The method of manufacturing a ceramic wiring board according to claim 19, wherein said glass composition is selected from the group consisting of borosilicate glass and aluminoborosilicate glass.

21. The method of manufacturing a ceramic wiring board according to claim 19, wherein said glass composition is one which becomes a glass ceramic upon sintering.

22. The method of manufacturing a ceramic wiring board according to claim 18, wherein said glass composition is selected from the group consisting of borosilicate glass and aluminoborosilicate glass.

23. The method of manufacturing a ceramic wiring board according to claim 18, wherein said glass composition is one which becomes a glass ceramic upon sintering.

* * * * *